US008268410B2

(12) United States Patent  
Moelle et al.

(10) Patent No.: US 8,268,410 B2
(45) Date of Patent: Sep. 18, 2012

(54) COATING SYSTEM AND METHOD FOR COATING, AS WELL AS COATED ARTICLES (75) Inventors: Christoph Moelle, Mainz (DE); Lars Bewig, Bad Gandersheim (DE); Thomas Kuepper, Bad Gandersheim (DE)

(73) Assignee: Schott AG (DE)

( * ) Notice: Subject to any disclaimer, the term of this patent is extended or adjusted under 35 U.S.C. 154(b) by 1042 days.

(21) Appl. No.: 11/937,279

(22) Filed: Nov. 8, 2007

(65) Prior Publication Data
US 2008/0113109 A1 May 15, 2008

(30) Foreign Application Priority Data

Nov. 10, 2006 (DE) .......................... 10 2006 053 365
Aug. 9, 2007 (DE) .......................... 10 2007 037 527

(51) Int. Cl.
*H05H 1/24* (2006.01)
(52) U.S. Cl. ....................................................... 427/569
(58) Field of Classification Search .................. 427/569
See application file for complete search history.

(56) References Cited

U.S. PATENT DOCUMENTS

| 4,761,269 | A | | 8/1988 | Conger et al. | |
| 5,146,869 | A | * | 9/1992 | Bohannon et al. | 118/724 |
| 5,324,361 | A | * | 6/1994 | Etzkorn et al. | 118/719 |
| 6,025,013 | A | * | 2/2000 | Heming et al. | 427/9 |
| 2003/0089308 | A1 | | 5/2003 | Raaijmakers | |
| 2003/0091753 | A1 | | 5/2003 | Han et al. | |
| 2003/0180458 | A1 | | 9/2003 | Sneh | |

FOREIGN PATENT DOCUMENTS

| CN | 1067686 A | 1/1993 |
| DE | 10258678 A1 | 7/2004 |
| DE | 10 2004 042 431 A1 | 3/2006 |
| EP | 0519215 A1 | 5/1992 |
| EP | 1630848 A1 | 1/2006 |
| JP | H09-511019 A | 11/1997 |
| WO | 03062490 A2 | 7/2003 |

OTHER PUBLICATIONS

Zhang Xiaodong, "Chinese Patent Application No. 2007101997826 Office Action", Sep. 25, 2009, Publisher: The Patent Office of the People's Republic of China, Published in: CN.
Dr. Ostermeier, "DE Patent Application No. 10 2007 037 527.3-45 Office Action", Oct. 10, 2008, Published in: DE.
Kikuchi, Noriyoshi, "JP Application No. 2007-290709 Office Action Sep. 12, 2011", , Publisher: JPO, Published in: JP.

* cited by examiner

*Primary Examiner* — Kelly M Gambetta
(74) *Attorney, Agent, or Firm* — Kaplan Breyer Schwarz & Ottesen LLP (57) ABSTRACT In the case of CVD methods, comprising PECVD and PICVD methods, the aim of the invention is to improve the impurity-free and, as far as possible, temporally and quantitatively precise feeding of process gases for the targeted layer systems. To this end, the invention provides a coating system and a method for coating articles with alternating layers, in the case of which process gases are introduced in an alternating fashion into a gas mixing point and mixed with a further gas and led to the reaction chamber, in which the deposition is carried out by producing a plasma.

14 Claims, 6 Drawing Sheets

COATING SYSTEM AND METHOD FOR COATING, AS WELL AS COATED ARTICLES

The invention relates to a coating system, in particular a CVD coating system, methods for coating and coated articles.

Product improvement by the application of multilayer systems is becoming increasingly important. For example, optical components are nowadays no longer conceivable without antireflection, colouring or generally phase front influencing layer systems.

However, layer systems can exert substantial influence on the value of a product even in the everyday sphere. Barrier layers can reduce the permeation of undesired materials in plastic vessels, and thus improve the quality and durability of the substances stored therein. Medical agents, or else foodstuffs are centre stage in this regard.

The quality of the applied layer systems and their economic producibility is of decisive importance in this case for the respective fields of use.

In the case of optical active layers which can influence the reflectance and/or spectral absorptive behaviour, changes in the refractive index of the applied layers which are abrupt and as steep as possible are important in order to be able to influence penetrating phase fronts of a light wave field locally in a way defined as effectively as possible at these changes in refractive index.

In addition to these changes in refractive index which are as steep as possible, however, the thickness and composition and, in particular, the density of the applied layers are also important, since these define the effective optical path length difference in the multilayer system and directly influence the properties of the end product obtained.

Moreover, it is necessary to keep these parameters constant over a relatively large flat region, in order not to produce spectral deviations in the form of local extended defects.

Consequently, the purity, defined feeding of layer-producing substances and their controlled reaction are an important key for the product quality to be obtained, and also for the efficiency of the coating method.

EP 0 519 215 B1 discloses a system for coating substrates in the form of spherical caps by means of plasma-induced vapour phase deposition. The system can be used to coat a number of substrates simultaneously, a gas distribution device being provided with the aid of which three gases can be mixed with one another. A dedicated gas line is provided respectively for the three gases, and these are brought together into a common gas line opening into a gas inlet channel. A gas which is continuously admixed flows continuously through the gas line, while the two other gases are admixed with the aid of quickly switching valves.

Furthermore, bypass lines provided with valves are made available in order to guide the gas respectively not required via the corresponding bypass line to the pump, and thus to keep the gas mass flow constant. A further disadvantage of known apparatuses and methods is that impurities can arise in the layers owing to the enrichment of reaction products in the plasma.

Particularly in the case of CVD methods, comprising PECVD and PICVD methods, the aim of the invention is therefore to improve the purity of deposited layers, and to feed the process gases for the targeted layer systems in a way that is a free as possible from impurities and as timely and precise in terms of quantity as possible.

This object is already achieved in a surprisingly simple way with the aid of an apparatus and a method as specified in the independent claims. Advantageous refinements and developments of the invention are specified in the dependent claims.

Consequently, the invention provides a coating system for coating articles, in particular with alternating layers, preferably for simultaneously coating a number of articles with alternating layers,
which comprises
at least one reaction chamber in which articles to be coated can be arranged, or a device intended for forming a reaction chamber with an article to be coated. The system further comprises a feed for process gases, in particular precursor gases, used during coating, a source for electromagnetic energy which can be operated in a pulsed fashion in order to ignite a plasma in the reactor filled with the process gas, and a control device for controlling the source.

In this case, the control device is set up to control the source such that during operation the latter outputs pulses of electromagnetic energy such that a pulsed plasma is produced in the reactor.

A simple linear regulatory is found in this case for the lower boundary of the pulse pause. It is particularly preferred to set the pause between the plasma pulses by means of the control device such that it is longer than $P[ms]=2.5+0.05*V$, preferably $P[ms]=2.5+0.055*V$, $P[ms]$ denoting the pause in milliseconds, and V the coating volume in the reaction chamber in milliliters.

For small reactor volumina the lower boundary of the pulse pauses for optimum layer deposition increases somewhat faster with increasing reactor volume. According to a preferred refinement, the lower boundary may for this purpose as well be defined by following expression:

$$P[ms]=V\cdot[(\tfrac{1}{6})\cdot\exp(-V/300)+(\tfrac{1}{20})].$$

This curve intersects the above defined line $P[ms]=2.5+0.05*V$ and yields smaller values for the pulse pauses for very small reactor volumina. In this range the lower boundary of the pulse pause may be again chosen by.

$P[ms]=2.5+0.05*V$, preferably $P[ms]=2.5+0.055*V$ in order to avoid too short pulse pauses. In other words, according to this refinement of the invention, the length of the pulse pause is limited by a lower boundary which is given by the maximum of the relations $P[ms]=V\cdot[(\tfrac{1}{6})\exp(-V/300)+(\tfrac{1}{20})]$ und $P[ms]=2.5+0.05*V$:

$$P[ms]=\max(2.5+0.05*V,\ V\cdot[(\tfrac{1}{6})\cdot\exp(-V/300)+(\tfrac{1}{20})]).$$

Specifically, the control device is set up to control the source such that the source outputs temporally spaced pulses which produce plasma pulses with a duration of length D and a pause of length P between the pulses, it being valid for the plasma pulses that the pulse pause P in milliseconds is longer between two temporally adjacent pulses than the relationship specified above.

The coating method which can be carried out by means of this coating system and which has the pauses specified above between the individual plasma pulses enables a complete gas exchange in the reactor volume during the pulse pause. In general, the length of the pulses corresponds to electromagnetic energy substantially of the length of the plasma pulses produced thereby such that the control device can control the source in these cases such that the source outputs pulses of electromagnetic energy which are temporally spaced in accordance with the relationship specified above. If, on the other hand, delays occur in the igniting of the plasma after switching on or the beginning of the electromagnetic pulse, this delay time can be taken into account as appropriate. In this case, the control device will control the source such that the pauses between electromagnetic pulses are appropriately shorter such that the desired pause results between the plasma pulses. Since the relationship specified above represents a lower bound, it is, however, generally possible also to use this relationship for the electromagnetic pulses. Adapting the pulse pause to the reactor volume has yet a further particular advantage. If the reactor volume is only partially emptied before the next plasma pause is ignited, an incomplete coating comes about upon the next plasma pulse as compared with a plasma pulse after a complete gas exchange, since in the first case there is a lesser concentration of precursor gas in the reactor volume. Thus, adapting the minimum pulse pause to the reactor volume has the effect that a quantity of layer material is deposited which can always be reproduced. Consequently, the layer thickness of the individual plies can be set with particular accuracy. Overall, a particularly high quality is attained thereby in the case of optical interference layer systems.

A microwave high-frequency or radiofrequency source which can be operated in a pulsed fashion is preferred as source. For example, microwaves with a frequency of 2.45 GHz, that is to say the same frequency as is also used widely in domestic microwave units, are suitable.

In the case of the deposition of alternating layers such as, in particular, of multiple interference layer systems by means of plasma-aided chemical vapour phase deposition, it is, moreover, extremely advantageous for the quality, or the optical properties of the layer system, when the interfaces between the individual plies of the layer system are defined as sharply and well as possible. It is disadvantageous in this case when residues of the previous precursor are still present in the coating volume after a gas exchange to an atmosphere with another precursor. In this case, reaction products of the previous precursor are deposited in the subsequent ply. Thus, it is then possible, for example, for titanium oxide to be present in the silicon oxide plies in an alternating layer system having alternating $SiO_2$—$TiO_2$ plies, and conversely. Since highly active interference alternating layer systems, in particular, have a multiplicity of plies, preferably more than 30 plies, it is necessary to carry out many consecutive gas exchanges. These gas exchanges are intended to be as fast as possible for an economic process, however, on the other hand, it should be possible to carry them out in a fashion as free from mixing as possible in order to attain a high quality of the layer system. In order to achieve this object, the invention provides a coating system for coating articles with alternating layers, preferably for simultaneously coating a number of articles with alternating layers, which has at least one reaction chamber in which articles to be coated can be arranged, or a device intended for forming a reaction chamber with an article to be coated. A feed is provided with the aid of which process gases, in particular precursor gases, used during coating can be introduced into the reaction chamber by a gas changing device. In this case, the gas changing device comprises at least one gas mixing point into which there open two supply lines, provided with valves, for various precursor gases, and at least one supply line for a further gas intended for mixing the latter in the gas mixing point with one of the gases introduced through one of the valves in order to produce different process gas mixtures, as well as a discharge line to the reaction chamber. The supply line for a further gas and the discharge line to the reaction chamber are connected in the connection between the two valves. Moreover, in each case a bypass line connected to a pumping device is provided in relation to each of the supply lines for various precursor gases, in each case a further valve being connected into the bypass lines. Moreover, a control device is provided which, in order to change the process gas mixture, controls the valves in the bypass lines and the valves of the supply lines for various precursor gases such that the valve in the supply line of a precursor gas is closed while simultaneously the valve in the bypass line for this precursor gas is open, and conversely after the closure of the valve in the supply line of a precursor gas the valve in the supply line of the other precursor gas is open while the valve in the bypass line for this precursor gas is simultaneously closed. A pause can be present between the closure of the valve in the supply line for one precursor gas and the opening of the other valve in the supply line for the further precursor gas. This pause is kept as short as possible, or even omitted completely. In the latter case, the four abovenamed valves switch simultaneously.

Even in the case of directly consecutive gas pulses of different composition for the purpose of depositing on alternating layer systems, it is particularly advantageous when changing the gas mixture to observe a pause between the pulse series of microwave pulses respectively used for depositing the individual plies. This pause between two pause series ensures that no plasma pulses are produced when process gas is being changed. Were the source of electromagnetic energy to be further operated as the process gas is being exchanged, this would then result in a deposition of a mixed oxide with metal oxides of both process gas mixtures. It is true that such a mixed oxide ply would be extremely thin, since the process gas change generally takes place over the duration of only one or a few plasma pulses, but it nevertheless surprisingly leads to a less well defined interface between the plies, which markedly influences the optical properties. Conversely, a marked improvement in the quality of optical alternating layer systems can be achieved when observing a pause between the pulse series which is synchronized with the valve control. Provided to this end in accordance with the invention are a coating system and a method for coating articles with alternating layers, the system comprising at least one reaction chamber in which articles to be coated can be arranged, or a device intended for forming a reaction chamber with an article to be coated. Moreover, a source for electromagnetic energy which can be operated in a pulsed fashion is provided in order to ignite a pulsed plasma in the reactor. By means of a feed the process gases, in particular precursor gases, used during coating are introduced into the reaction chamber by a gas changing device of the coating system. The gas changing device comprises at least one gas mixing point into which there open at least two supply lines, provided with valves, for various precursor gases, and at least one supply line for a further gas intended for mixing the latter in the gas mixing point with one of the gases introduced through one of the valves in order to produce different process gas mixtures, as well as a discharge line to the reaction chamber. In an advantageous refinement, the supply line for a further gas and the discharge line to the reaction chamber are connected in the connection between the two valves, in each case a bypass line connected to a pumping device being provided in relation to each of the supply lines for various precursor gases, in each case a further valve being connected into the bypass lines.

Moreover, a control device for the valves and the source is provided which, in order to change the process gas mixture, controls the valves in the bypass lines and the valves of the supply lines for various precursor gases such that the valve in the supply line of a precursor gas is closed while simultaneously the valve in the bypass line for this precursor gas is open, and conversely the valve in the supply line of the other precursor gas is open while the valve in the bypass line for this precursor gas is simultaneously closed. Moreover, the control device sets the instant at the beginning of a pulse series for depositing a ply of the alternating layer system as a function of the switching time of the valves, the control device setting between the pulse series a pause duration of at least $0.8 \times |t_{advance} - t_{return}|$ and at most $5 \times |t_{advance} - t_{return}|$, $t_{advance}$ denoting the time duration required for the gas to reach from the gas mixing point as far as the reaction chamber, and $t_{return}$ denoting the time duration required to empty the process gas mixture previously located in the reaction chamber. This embodiment of the invention is not necessarily limited to the specific arrangement of the valves with bypass lines. What is essential here is that the travel time of the gas pulses emanating from a gas mixing point and guided through a supply line into the reactor, and the emptying time of the reactor are taken into account when driving the source, and corresponding pauses, specified as above, are set between pulse series.

In order to synchronize the beginning of a pulse series with the infilling of the process gas mixture respectively provided for depositing a ply, it is, moreover, advantageous when the source is controlled by means of the control device such that a pulse series for depositing a ply of the alternating layer system is respectively started at an instant which is delayed by a duration T in relation to the switching instant of the assigned valves for the respective process gas mixture in the supply line for depositing a ply of the alternating layer system. The duration T is preferably in a range from at least $0.8 \times t_{advance}$ up to—depending on the length of the supply line—at most $500 \times t_{advance}$, preferably up to at most $50 \times t_{advance}$. Coming into this consideration as device intended for forming a reaction chamber with the article to be coated is, in particular, a sealing device with the aid of which a region of the surface of the article to be coated can be separated from the surroundings such that the region thus separated, which is delimited by the surface of the article, can serve as reaction chamber. This region can be evacuated, the process gas let in, and a plasma ignited in this region. An example of this is an internal coating of spherical caps such as, for example, spherical headlamp caps. Here, the inside of the spherical cap can be separated from the surroundings by sealing at its edge, the region thus formed and delimited by the inside of the spherical cap then forming the reaction chamber.

In order to deposit the plies of the coating, it is possible, in particular, to guide electromagnetic energy into the coating region such that a plasma is ignited. The reaction products forming in the plasma of the process gas mixture in this case are deposited on the surface of the article to be coated.

In the meaning of the invention, a precursor gas is, in particular, a compound of a layer-forming element. Particular use is made here of various metal or semiconductor compounds such as silicon compounds, for example HMDSO (hexamethyldisiloxane) or compounds of metals whose oxides form high-index layers. Mention may be made here, for example, of titanium chloride or niobium chloride for depositing titanium oxide layers and niobium oxide layers, respectively. These can then be combined to form an interference alternating layer system, for example in alternation with silicon oxide plies which are deposited from a silicon-containing precursor.

Oxygen or a gas mixture having oxygen can, in particular, be used as further gas which is mixed with the precursor gas or gases in the mixing point. The oxygen then reacts in the plasma with the precursors or their reaction products such that oxide layers having the metals bound in the precursor gases are deposited.

The corresponding method, to be carried out with the aid of the coating system, for coating articles with alternating layers, preferably for simultaneously coating a number of articles with alternating layers, is based on the fact that an article to be coated is arranged in at least one reaction chamber, or a reaction chamber is formed with an article to be coated, at least the coating region of the reaction chamber is evacuated, and various process gases are led sequentially into the coating region, and a plasma for deposition is ignited, as a result of which a layer system with plies of different composition is deposited on the article, the introduction of the process gases into the reaction chamber being performed by means of a gas changing device, the gas changing device comprising at least one gas mixing point into which there open two supply lines, provided with valves, for various precursor gases, and at least one supply line for a further gas, this further gas being mixed in the gas mixing point with respectively one of the gases introduced through one of the valves and being carried away to the reaction chamber by a discharge line, the supply line for a further gas and the discharge line to the reaction chamber being connected in the connection between the two valves, and in each case a bypass line connected to a pumping device being provided in relation to each of the supply lines for various precursor gases, in each case a further valve being connected into the bypass lines, and the process gas mixture being changed by switching the valves in the bypass lines and the valves of the supply lines for various precursor gases such that the valve in the supply line of a precursor gas is closed while simultaneously the valve in the bypass line for this precursor gas is open, and—possibly after a pause—conversely the valve in the supply line of the other precursor gas is open while the valve in the bypass line for this precursor gas is simultaneously closed.

In this way, the invention produces discrete gas pulses of different gas compositions which do not mix together. It is, in particular, advantageous when in this case the process gas in the coating volume in the reactor chamber for a ply can be carried away completely or at least substantially completely before the next gas pulse with another process gas passes into the reaction chamber.

Switching over the valves with a prescribed time delay produces a fast gas change which, in the case of deposition of alternating layers such as, in particular, interference layer systems, firstly ensures particularly pure layers, and secondly also ensures sharp interfaces between the individual plies of the layer system.

The optimum pulse pause between the plasma pulses can also be a function of the coated substrate and the required layer structure of the plies, and also be selected, for the purpose of obtaining optimal results, to be substantially longer than the minimum duration specified above. In accordance with a development of the invention, to this end the pause is set longer than $$P[ms] = 10 + 0.133 * V,$$

P[ms] denoting a time duration in milliseconds, and V denoting the coating volume in the reaction chamber in milliliters.

On the other hand, an excessively long pause between the plasma pulses is disadvantageous for the process speed. It has emerged that the pulse pause can generally be set to a time duration of less than $P[ms] = 80 + 0.05 * V$, in order still to obtain plies of exactly defined layer thickness. Generally, in most cases good coatings are achievable using pulse pauses shorter than $P[ms] = 60 + 0.05 * V$, preferably shorter than $P[ms] = 50 + 0.05 * V$.

In order to obtain the smallest possible effects of the switching operation on the gas flow when switching over between the various process gas mixtures, it is provided to adapt the pressures in the bypass lines to the pressure in the gas mixing point. This can be done, in particular, with the aid of a regulator. It is desirable to adapt the pressure as exactly as possible, but preferably the pressure in the bypass lines should be adapted to the pressure in the gas mixing point to a pressure difference which is less than 20% of the pressure in the gas mixing point.

It is, moreover, particularly advantageous for exact regulation of the gas flows to provide a mass flow regulation in which there occurs at the regulation site a flow which is strongly accelerated and therefore substantially freed from reactions. To this end, a regulator is provided with the aid of which a pressure drop along the supply lines as the gases are being fed into the gas mixing point is maintained or set by a factor of more than two. This pressure drop can take place at a needle valve, for example a needle valve of a mass flow regulator, or else at an orifice, for example.

According to a further alternative or additional embodiment of the invention, a coating system is provided for coating articles with alternating layers, preferably for simultaneously coating a number of articles with alternating layers, which comprises at least one reaction chamber in which articles to be coated can be arranged, having a feed for the process gases, in particular for precursor gases, used during coating, which gases can be introduced into the reaction chamber by a gas changing device, the gas changing device comprising at least one gas mixing point, the gas mixing point being a component of a mixing point valve unit which comprises two valves which are connected to two supply lines for various precursor gases of a process gas mixture, as well as at least one supply line for a further gas intended for mixing the latter in the gas mixing point with one of the gases introduced through one of the valves, and a discharge line to the reaction chamber, the supply line for a further gas and the discharge line to the reaction chamber being connected in the connection between the two valves. The distances between the two valves for the precursor gases are minimized by means of the mixing point valve unit. An improved discharge of the gas from the mixing point in the pulse pauses, or when the process gas is being changed in order to deposit an alternating layer system is achieved in this way. In order to provide a compact mixing point valve unit, the valve seats of the two valves can be combined, in particular, in a common valve block.

The method which can be carried out with the aid of this embodiment of the invention for coating articles with alternating layers, preferably for simultaneously coating a number of articles with alternating layers, is based correspondingly on articles to be coated being arranged in at least one reaction chamber, at least the coating region of the reaction chamber being evacuated, and various process gases being led sequentially into the coating region and a plasma being ignited for deposition, as a result of which a layer system with plies of different composition is deposited on the article, the introduction of the process gases into the reaction chamber being performed by means of a gas changing device, and the gas changing device comprising at least one gas mixing point which is designed as a mixing point valve unit, preferably having valve seats brought together in a valve block and which comprises two valves which are connected to two supply lines for various precursor gases of a process gas mixture, and at least one supply line for a further gas, and a discharge line to the reaction chamber, the supply line for a further gas and the discharge line to the reaction chamber being connected in the connection between the two valves, the further gas being mixed in the gas mixing point with one of the gases introduced through one of the valves and being fed to the reaction chamber, and another gas composition being mixed in the gas mixing point by switching the valves in order to deposit a ply of another composition.

The mixing point valve unit is to be used to minimize dead spaces in the form of volumes open only on one side and which are formed in the mixing point region by supply lines to closed valves. In any case, these supply line regions should be as short as possible by comparison with the discharge line to the reaction chamber. It is provided to this end in a development of the invention that the connection between the valve seats of the two valves to the middle of the gas mixing point is respectively smaller than $1/10$ of the length of the discharge line from the gas mixing point as far as the reaction chamber.

It has further emerged that a substantial improvement in the layer quality, particularly in the case of the simultaneous coating of a number of articles, as well, can be attained when a rectilinear path from the gas mixing point to the reaction chamber or chambers is avoided. The cause of this is to be seen in that mixing of the process gases which is only incomplete can occur in the case of a rectilinear connection. Thus, in the case of a number of reaction chambers driven in parallel it can then happen that the gas mixtures flowing into the individual chambers have different compositions. In order to avoid such problems, provision is made, furthermore, of a coating system for coating articles with alternating layers, preferably for simultaneously coating a number of articles with alternating layers, which has at least one reaction chamber in which articles to be coated can be arranged, or a device intended for forming a reaction chamber with an article to be coated, and a feed for process gases, in particular precursor gases, used during coating, which gases can be introduced into the reaction chamber by a gas changing device, the gas changing device comprising at least one gas mixing point into which there open two supply lines for various precursor gases, and at least one supply line for a further gas intended for mixing the latter in the gas mixing point with one of the gases introduced through respectively one of the supply lines in order to produce different process gas mixtures, a discharge line going out to the reaction chamber from the gas mixing point. According to the invention, this discharge line to the reaction chamber now comprises a detour line which runs with a number of diversions to the reaction chamber such that turbulent mixing of the gases brought into contact with one another in the gas mixing point occurs. To this end, the detour line can be designed in a simple way as a tube with a number of diversions or kinks. Alternatively, or in addition, it is possible to install obstacles in the line which lead to eddies in the gas flow.

With regard to the line system from the gas feeding device to the reaction chambers, it has, furthermore, proved to be particularly advantageous when a line of the line system is split into respectively exactly two lines. This configuration of the supply lines surprisingly leads to particularly reliable igniting of the plasma in all the connected reaction chambers and, moreover, to exact splitting of the gas flow such that the most equal possible gas pressures can be produced in all the reaction chambers. Consequently, according to yet another alternative of additional embodiment of the invention, there is provided a coating system for simultaneously coating a number of articles with alternating layers by means of plasma-aided chemical vapour phase deposition having a number of reaction chambers or devices intended for forming reaction chambers with articles to be coated, in which articles to be coated can be arranged, a gas feeding device having a discharge line to the reaction chambers, and a device for irradiating electromagnetic energy in order to ignite a plasma in the region filled with the process gas in the reaction chambers. In this case, the discharge line is split into a number of branches which are respectively connected to a reaction chamber, respectively exactly two branches departing from one line of the line system with discharge line of the gas feeding device and the branches of a line such that the discharge line is split into $2^n$, n=2, 3, . . . branch lines, and the supply lines for each chamber are split equally often. Such a line system therefore presumes a tree to a certain extent, the main line being split into two branches, and in each branch again being split into two further branches. For n>2 and a corresponding number of reaction chambers, this way of doubling the supply line is repeated corresponding often.

The corresponding method which can be executed with the aid of this coating system is based on the fact that a number of articles to be coated are arranged in a number of reaction chambers, or a number of reaction chambers are formed with articles to be coated, at least the coating regions of the reaction chambers are evacuated, and process gas is led into the coating regions and a plasma for deposition is ignited such that a coating is deposited, the introduction of the process gases into the reaction chambers being performed by means of a discharge line starting from a gas mixing point. In this case, various gases of the process gas are mixed in the mixing point, and the gas flow via the discharge line is split into $2^n$, n=2, 3, . . . branches into correspondingly many subflows which are respectively led into a reaction chamber, each subflow being split away equally often from the gas flow and being divided into exactly two subflows at each division of the gas flow.

With regard to igniting the plasma reliably in the individual reaction chambers, this way of splitting the gas flows has proved to be superior to splitting in the case of which the gas flow is split at the same point into more than two, for example four subflows. This is valid even for a gas distribution in the case of which, for example, a symmetrical arrangement of four branches departing at a point of the discharge line is implemented.

The uniformity of the splitting of the gas flow can, furthermore, also be further improved by having the branch lines branch off from the discharge line in a plane. It is also possible here, in particular, further to implement a modular design of the coating system in which a number of gas mixing points are provided which are arranged along a direction transverse to the plane in which the branches lie, preferably perpendicular to this plane. In the case of this embodiment of the invention, the units assigned to a gas mixing point can then be designed with reaction chambers as modules which can be juxtaposed in any desired number.

The deposition of the layers can, furthermore, advantageously be monitored with the aid of a spectrometer arrangement for time-resolved acquisition of emission lines and/or spectra which are produced during coating inside the reaction chamber. Due to the acquisition of the spectra and/or emission lines, it is also possible, inter alia, advantageously to correct the temporal control of the valves, the mass flow regulators and/or the pressure regulation.

The invention is described in more detail below with the aid of preferred embodiments and with reference to the attached drawings, in which.

DETAILED DESCRIPTION OF THE INVENTION

The invention is described below in more detail with the aid of preferred embodiments, although the illustrations undertaken in the figures are intended merely for explanation by way of example and are not true to scale.

The aim of the invention is also, in particular, to enable a quicker, cleaner gas exchange for a CVD process, preferably a PECVD or PICVD process with two or more reaction gases, in particular for CVD high rate processes and for large CVD systems with a number of modules in which large gas quantities in a relatively fast change (for alternating layers) have to be made available, and these gas quantities must be distributed over all the modules precisely, that is to say uniformly. A uniform distribution is very important, because the quantity of gas made available features directly in the current coating rate at the respective coating station.

Important aspects of the invention in this case comprise, in particular, switching over the valves of the supply lines to the gas mixing point, a gas mixing point with dead space minimization of the gas feed, and a detour line which is designed as mixing line, as well as a distributor tube, which is designed as a double tube, and a respective splitting up of the station, preferably in a modular design.

The following description of the invention describes preferred and particularly preferred properties of the invention which in this stage can respectively also be used in combination in further embodiments not described in detail.

Figure 1:
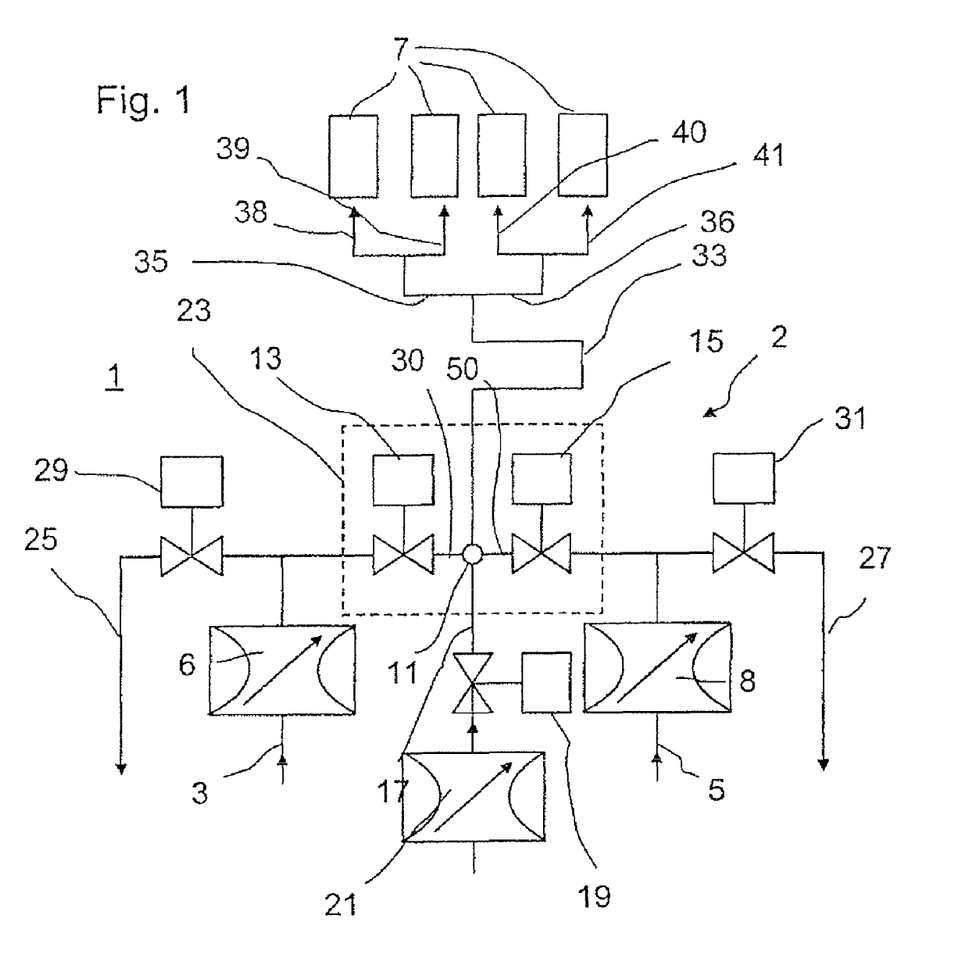
FIG. 1 shows parts of a coating system.

To this end, FIG. 1 shows a part of a coating system 1 having a gas changing device 2 and the reaction chambers 7. The gas changing device 2 comprises two supply lines 3, 5 for various precursor gases. For example, a silicon precursor gas can be fed via one of the lines 3, 5, and a titanium precursor gas can be fed via the other one of the lines 3, 5. The gas flows of the precursor gases are regulated with the aid of mass flow regulators 6, 8. The supply lines 3, 5 open in a way that can be shut by means of the valves 13, 15 into a gas mixing point 11. Also opening into this gas mixing point 11, which is arranged in the connection between the two valves, is a supply line 17 for a further gas which is mixed with the precursor gas(es), respectively switched in, in the gas mixing point 11. The supply line 17 can also be shut by means of a valve 19, and the gas flow through this line 17 is regulated with the aid of a mass flow regulator 21.

The gas changing device 2 also comprises two bypass lines 25, 27 which respectively branch off from the supply lines 3, 5 upstream of the valves 13, 15, and which can respectively be shut with the aid of a valve 29, or 31, respectively. These bypass lines are connected to one or more pumps.

A preferred embodiment of an inventive valve switchover is described below with the aid of FIG. 1.

Depositing multi-ply layer systems requires changing between various precursor gases for the individual layer materials. The quality of the layer system, in particular the interface regions between the individual layers, requires a gas exchange which is as fast as possible, but is at the same time as free from mixing as possible. This can be achieved by means of a stationary, continuous flow of the precursor gases over the entire duration of the coating process. If the appropriate layer material has just been deposited, this stationary flow of a precursor gas is guided into the gas mixing point 11, the valve 13 or 15 being opened in the supply line, depending on the required precursor gas, and the valve 29 or 31 in the bypass line being closed.

In another case, the gas flow flows into the bypass line 25 or 27, the respective valve 13 or 15 being closed.

A decisive advantage of this principle is that no circling process is required for the gas flow, in particular an initially standing gas column need not accelerate until a stationary flow state is reached. A precursor gas can therefore be changed from another one virtually synchronously. The pressure in the bypass lines of the precursor gases is in this case set to be identical to the pressure in the gas mixing point, and so pressure conditions as identical as possible prevail irrespective of whether the precursor gas is led with the aid of the valves into the mixing point 11 or into the respective bypass line 25 or 27. To a certain extent, the bypass lines 25, 27 reflect the gas mixing point 11 for the case in which the corresponding precursor gas is currently not required in the process.

The gas supply with precursor substances is thus implemented by combination of in each case two valves 13, 29 or 15, 31 for each gas supply line 3, 5.

The gas is then either guided directly into the reaction chambers 7, in a fashion admixed with oxygen from the line 17, or discharged directly to the pump unused via the bypass line 25 or 27.

Switching over alternately between both (at least two) gases is performed synchronously in this case, that is to say two valves are always switched simultaneously at virtually the same time. Overall, there are three possible valve positions for the use of two precursor gases (for example $TiCl_4$ and HMDSO in order to produce $TiO_2$ and $SiO_2$ alternating layers), oxygen additionally also being introduced as reaction gas at the gas mixing point via the supply line 17. It is assumed in the following table of the valve positions that HMDSO is supplied as silicon precursor via the line 3, and $TiCl_4$ is supplied as titanium precursor via the line 5.

| Current process | Si valve | Si valve | Ti valve 15 | Ti valve | $O_2$ valve |
|---|---|---|---|---|---|
| None | Closed | Open | Closed | Open | Closed |
| Ti | Closed | Open | Open | Closed | Open |
| Si | Open | Closed | Closed | Open | Open |

A particularly preferred embodiment further comprises a gas mixing point with dead space minimization, in particular in a mixing point valve. This mixing point valve is distinguished in that it minimizes the dead space between the two gas supply lines 3, 5 in absolute terms. To this end, the two valves 13, 15 of the two gas supply lines 3, 5 are brought as close to one another as possible with their valve seats.

Sections 30, 50 of the supply lines 3, 5 between the valves 13, 15 and the gas mixing point 11 are to be kept as short as possible so that including a process gas change the gas present in these sections is discharged as quickly as possible with the valves 13, 15 shut. To this end, the valve seats of the valves 13, 15 are integrated in the form of a valve block 23 with the gas mixing point 11 in a mixing point valve unit, that is to say the two valve seats are themselves a component of the valve block.

The two gas supply lines 30, 50 in the vicinity of the gas mixing point 11 should thus preferably be fashioned according to the invention such that the line path between the two valves 13, 15 is as short as possible.

Such a mixing point valve for mixing two gases preferably has 4 connections:
two feeds of the two gases (with very short lines for the purpose of minimizing dead space), (at least) one feed for the oxygen, (at least) one discharge line of the gas mixture to the CVD reactor.

The aim of minimizing dead space is described below.

In an active coating process state, that is to say when one valve 13 or 15 is opened and the other is closed, the gas required for this coating can penetrate the gas line of the other gas as far as the valve thereof. When the gas is changed, something which is generally the case with optical alternating layers upon each switchover from one coating material to the next, after the synchronous switchover of the valves some of the gas of the previous coating step is initially further mixed with the new gas of the coating now desired and transported into the CVD chamber and deposited there as coating. Consequently, at the first instant of each coating step the gas composition is not exactly defined, and therefore it is also impossible to deposit precise, thin individual layers which are cleanly separated from one another in alternating layer systems for optical applications.

This would otherwise lead to difficulties when starting the respective next coating process in an alternating layer system, and the system would need instead firstly to be flushed for a length of time upon each change in coating, in order once again to flush out the undesired gases of the previous coating step to the extent that the next step in the coating process can begin.

The mass flow regulation of the gas feeding system is implemented by installing a needle valve or a very small orifice with an adapted fixed diameter in each of the feeding lines, that is to say in the pressure-regulated supply line 3 or 5 of each precursor gas and in the pressure-regulated feeding line 17 for oxygen.

The bypass lines 25, 29 are likewise pressure regulated. The design of the needle valves and orifices, as well as the setting of the pressures in the incoming lines, is selected in such a way that the flow occurring at the location of the needle valves or orifices is strongly accelerated and substantially freed from reactions. This presupposes for the pressure conditions that the pressures in the respective distributing lines, that is to say the forward pressures at the needle valves or orifices, are more than twice the back pressure. The back pressure corresponds to the pressure in the gas mixing point 11, in which the various process gases are brought together.

The principle of the strong acceleration of the flow offers a number of advantages:

The mass flow through the needle valves is directly proportional to the forward pressure present in the distributing lines, and dependent on the back pressure (=mixing point pressure). Pressure changes at the gas mixing point 11 can therefore not influence the mass flow of the individual process gases. The mass flow can therefore be set or changed in a simple way by varying the distributor pressures.

The strong acceleration of the flow prevents the backward transport of gas molecules by diffusion, or flow from the gas mixing point 11 into the supply lines. Reactive mixing of the various precursor gases is thus excluded. Moreover, in the case of a formation of flames at the gas mixing point or downstream thereof (in the direction of the reaction chambers 7) the strong acceleration of the flow prevents the flame front from breaking through at the rear in the direction of the gas producing source. This provides a flashback arrester.

The pressure in the gas mixing point 11 depends on the quantity of oxygen fed, on the geometry of the gas mixing point and on the line to the CVD reactor chamber, as well as on the pressure in the CVD reactor chamber. The quantity of the precursor gases is negligible by comparison thereto for preferred modes of operation in which more than 70% of oxygen is contained in the process gas mixture.

A typical value for the pressure at the gas mixing point is, for example, 10 mbar. In this case, the pressures in the supply lines 3, 5, 17, running to the gas mixing point, upstream of the mass flow regulators 6, 8, 21, are set to at least 20 mbar in this case, thereby ensuring the strong acceleration of the gas. If the coating of specific substrates requires a substantial increase in the oxygen flow, the pressure in the gas mixing point 11 increases as a result. In this case, it may likewise be necessary to increase the pressures in the distributing lines in order to ensure the strong acceleration in the flow conditions.

When at least a factor of 2 prevails between the forward pressure and back pressure, pressure changes downstream of the needle valve, for example of the respective mass flow regulator 6, 8, 21, do not influence the mass flow through the needle valve. Exactly the same mass flow is set up through the needle valve, irrespective of whether a lower pressure or a relatively high pressure prevails downstream thereof, as long as the factor of 2 or more is still reached. This is based on the physical principle of strong acceleration. If the gas feed supplying gas to a CVD system having pressure-regulated supply lines and just such discharge lines is additionally equipped with needle valves in the gas supply lines, and the latter are set such that the state of strong acceleration of the flow in the flow direction of the gas feed prevails at the needle valves, it is possible to fashion the gas regulation much more exactly and virtually absolutely free from reaction than when the needle valves are not included in the gas feeding system or are not set such that the physical state of this acceleration would prevail.

Were this inventive measure not implemented in the gas supply of a CVD system (that is to say were there no needle valves installed or were these open too far such that the state of strong acceleration is not set up), pressure changes at the gas mixing point in the case of a precursor gas, particularly upon each switchover to the bypass lines, and conversely would necessarily also lead to a change in the mass flow of the relevant precursor gas, that is to say a reaction would take place.

This reaction would lead to a linear dependence (increase or decrease in the mass flow of the relevant precursor gas) if the pressure were to be far removed from the state of this strong acceleration of the flow in the flow direction (that is to say the pressure at the gas mixing point would not be smaller by at least a factor of 2 than the pressure in the pressure-regulated feeding line).

In addition to this inventive prevention of the reaction through the production of the state of this acceleration, this acceleration also serves as flame protection and, in the case of formation of flames at the gas mixing point or downstream thereof (in the direction of the CVD reactors or reaction chambers), is intended to prevent the flame front from breaking through at the rear in the direction of the gas producing source (large quantities of flammable and/or explosive reaction chemicals in large reservoirs) (flash back arrester).

It follows that for the purpose of acceleration on the gas generating side at least twice as high a pressure must prevail as on the other side, facing the valve block.

A particularly preferred embodiment of the invention further comprises a detour line 33 as a component of the discharge line from the gas mixing point 11 to the reaction chambers 7.

The two gases brought together in the gas mixing point are guided further from the block valve 23 to the reaction chambers 7. The two gases brought together must mix together thoroughly in this case. Since the two gases in the gas mixing point flow out of the two supply lines into the common discharge line from two sides, they will not mix with one another on their own at the prevailing pressures, or will do so only unsatisfactorily (no turbulent flow).

Consequently, the invention ensures adequate thorough mixing on the path to the reactor by exciting turbulence. This can be achieved in principle by various mechanical measures, for example by introducing obstacles (in particular sharp-edged ones) which lead to flow separations, and thus to eddies. However, as shown in FIG. 1, a preferred inventive measure is to lay the line to the reactor in the form of detour lines with loops, S-curves, meandering etc., turbulent mixing of the at least two types of gas taking place in each case in the bends.

Great importance is attached to the distributing pipe used in the preferred embodiments, the point being that the task of the distributing pipe is to guide the incoming gas mixture to the individual coating stations in the most uniform fashion possible.

A further advantage for the most uniform distribution possible of the gas flow between the multiplicity of branches to the individual coating stations is, in addition, the design feature that the distributing pipe is designed as a double pipe: in one plane, for example on top, the central supply pipe runs, with splitting of the gas flow between the individual discharge lines, to the coating stations, while one or more discharge line(s) to the pump are arranged in another plane, for example below this plane.

Consequently, the discharge line with its strong suction force has virtually no more influence on the gas flow, and thus on the mass flow into the individual branches.

If, in another case, the connection of the discharge line were to be located on the same plane as the multiplicity of the branch lines, because of a pressure gradient building up the suction force on the branch lines located in the vicinity would be greater than those lying further removed therefrom, and those lying in the vicinity would be supplied proportionally with a somewhat less gas flow. Moreover, it is very advantageous for a uniform supply of the multiplicity of discharge lines to the individual coating stations when these discharge lines departing from the supply pipe all have the same spacing from one another.

It is particularly advantageous for the design of an inventive CVD coating system when every distributing line present in the system is built using this design principle.

A total of 5 supply lines are included in the exemplary block diagram of FIG. 1: one supply line and one discharge line each, for example bypass for each of the two types of gas, and a feed for oxygen. It is advantageous when each of these distributing lines is constructed using the inventive design principle, in order overall to attain a gas flow which is as uniform as possible.

In a further embodiment, it is particularly preferred to split the stations in a modular design.

It is certainly possible to build for each individual reaction chamber 7 an individual gas mixing point 11 with switching of the associated valves 13, 15, 29, 31 using a valve block 23, as set forth above, but it is particularly advantageous, instead of this, from a gas mixing point 11 downstream of the adjoining mixing line or detour line 33, for a branch line to be split into a number of single separate individual lines, leading respectively into a coating station, in order to produce turbulence.

According to the invention, it is particularly advantageous here to split this division into a number of "2 to the power n", where n=2, 3, . . . , since this enables the mass flow to be split uniformly between a multiplicity of individual coating stations in a simple design.

The branch line coming from the gas mixing point 11 is initially split here symmetrically into two lines 35, 36. As shown in FIG. 1, these two lines can then, once again, respectively be split, in turn, into two further lines 38, 39 and 40, 41, etc., such that individual CVD coating reactors or reaction chambers 7 can be supplied with a uniform mass flow of gas from one gas mixing point from 2, 4, 8, 16.

This embodiment of the invention is therefore based on the fact that the discharge line from the gas mixing point 11 is split into a number of branches 38, 49, 40, 41 which are respectively connected to a reaction chamber 7, respectively exactly two branches departing from one line of the line system with discharge line of the gas feeding device and the branches of a line such that the discharge line is split into $2^n$, n=2, 3, . . . branch lines, and the supply lines for each reaction chamber 7 are split equally often.

Here, it is particularly advantageous with this splitting into respectively two lines when the consecutively following splits occur in one and the same plane (surface). It is thereby possible for any desired number of gas mixing points 11 to be aligned one behind another in the third dimension without in this case any need to pay further heed to particular restrictions with regard to number or symmetries. Thus, for example, it is possible to implement 12 gas mixing points one behind another in a system of modular design, in which case a total of 12×4=48 individual coating reactors can be uniformly supplied with gas, starting from each gas mixing point, by consecutive two-fold splittings on two lines in each case.

Figure 2:
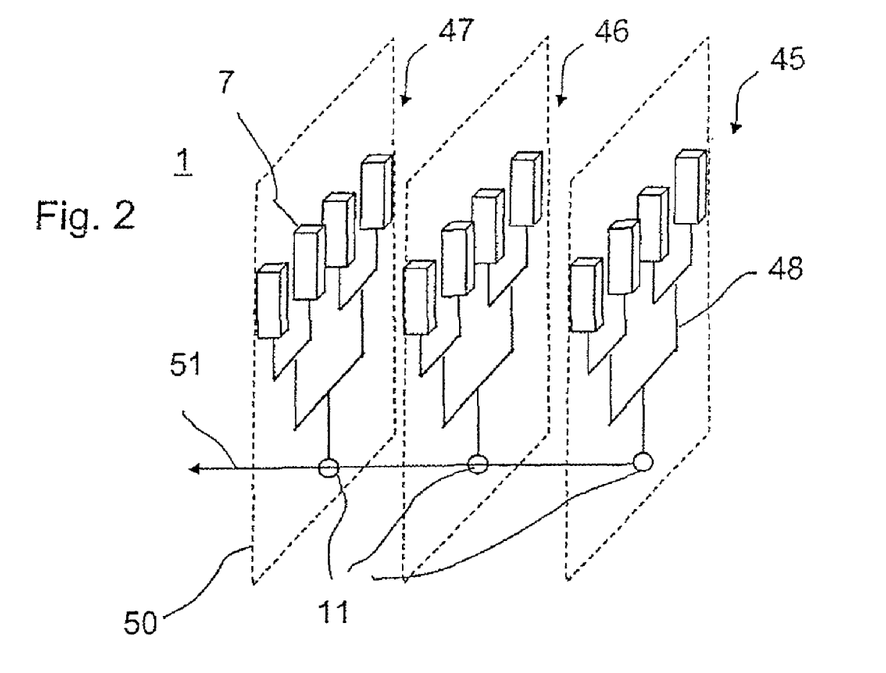
FIG. 2 shows a development of the coating system, shown in FIG. 1, with a number of modules which respectively have a number of reaction chambers.

A diagrammatic illustration of such a development of the invention is illustrated in a diagrammatic perspective view in FIG. 2. The coating system 1 comprises a number of modules 45, 46, 47, each in turn having a number of reaction chambers 7. In this case, the reaction chambers 7 are respectively connected in the modules 45, 46, 47 to a gas feeding system 48 which, as described above, exhibits a splitting of the discharge line starting from the gas mixing point 11 of the module into $2^n$ branches, exactly two branches starting from each branch point, and the branches opening into the reaction chambers 7 respectively being split equally often. In the example shown, the discharge line from the gas mixing points 11 split into $2^{2=4}$ branches, which correspondingly open into 4 reaction chambers 7. In each module, the lines of the gas feeding systems 48 lie respectively in parallel planes 50, the gas mixing points 11 being lined up along a direction 51 perpendicular to these planes 50.

Switching over the valve pairs 13, 29 and 15, 31 of the embodiment shown in FIG. 1 in order to change the process gas mixture need not be performed synchronously, but can be staggered in time. Although, just like switching over the valves 15, 31, switching over the valves 13, 29 is carried out synchronously, it is possible in this case by means of a suitable control to observe a pause between the opening of the valve 15 and the closing of the valve 13, and conversely. The effect of this pause is that the gas flow is guided to the reaction chambers in the form of discrete gas pulses such that the different process gas mixtures of successive gas pulses do not mix with one another.

Figure 3:
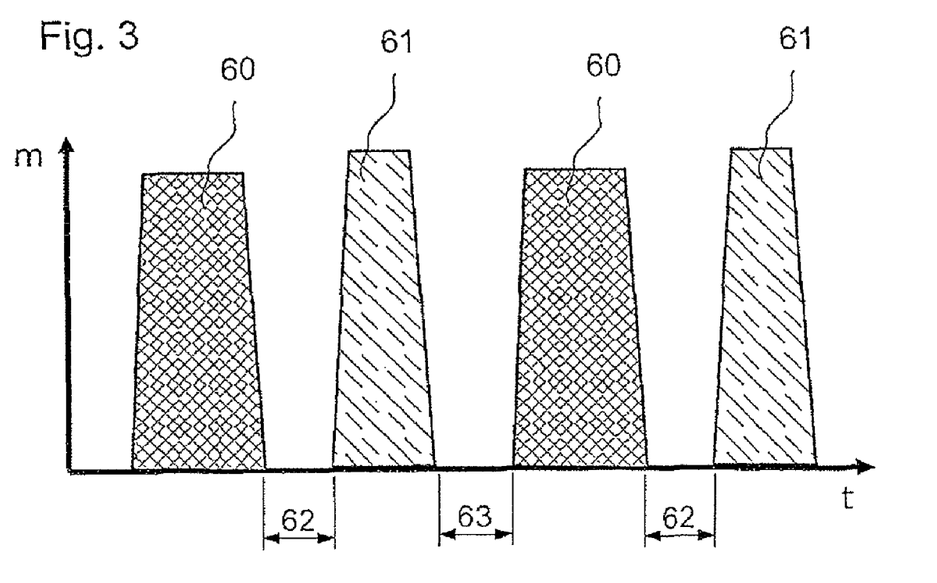
FIG. 3 shows a diagrammatic illustration of a characteristic pulse train shape of precursor gases which are located in the gas feed, illustrated in FIG. 1 or FIG. 2, of the CVD coating system, in particular the PICVD coating system.

For the purpose of explanation, FIG. 3 shows a diagram of the time profile of the mass flow in the discharge line to the reaction chambers. Gas pulses 60 of a first precursor gas mixture, and gas pulses 61 of a second precursor gas mixture are alternately fed from the gas mixing point through the discharge line. The mass flows of the gas pulses 60, 61 can also differ in this case. This also holds true, in particular, for their length. Thus, for example, when depositing an interference alternating layer system with layers which alternate as high index and low index layers it is generally sensible to adapt the layer thicknesses to their optical thickness.

If, for example, the aim is to deposit a sequence of layers with an optical thickness of a quarter wavelength, the layer thickness is higher for the low index plies. If the rate of deposition is similar for the high index and low index plies, the gas pulses are correspondingly set to be longer for the low index plies. Thus, in the case of the diagram shown in FIG. 3 the longer gas pulses 60 can be gas pulses of a gas mixture with a silicon precursor for depositing $SiO_2$ plies, and the shorter gas pulses 61 can be gas pulses of a gas mixture with a titanium precursor for depositing $TiO_2$ plies of higher index. Pulses 62, 63, which need not necessarily be of the same length, are respectively present between the pulses 60, 61. The aim is to control the gas changing system in such a way that the pauses 62, 63 are as short as possible. Ideally, the aim is an operation in which the gas pulses follow one another directly without mixing of the types of gas occurring. Consequently, the pauses 62, 63 should be as short as possible, and can even vanish in the ideal case.

Figure 4:
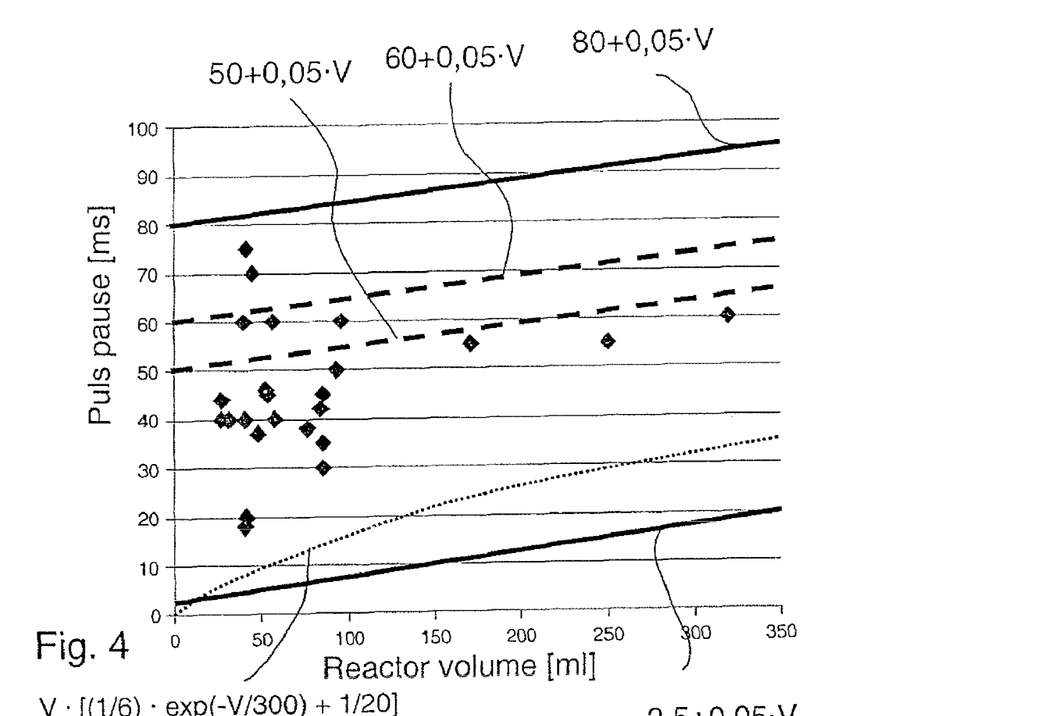
FIG. 4 and FIG. 5 show diagrams with empirical values for pulse pauses during the deposition of $TiO_2/SiO_2$ alternating layers on various substrates.
Figure 5:
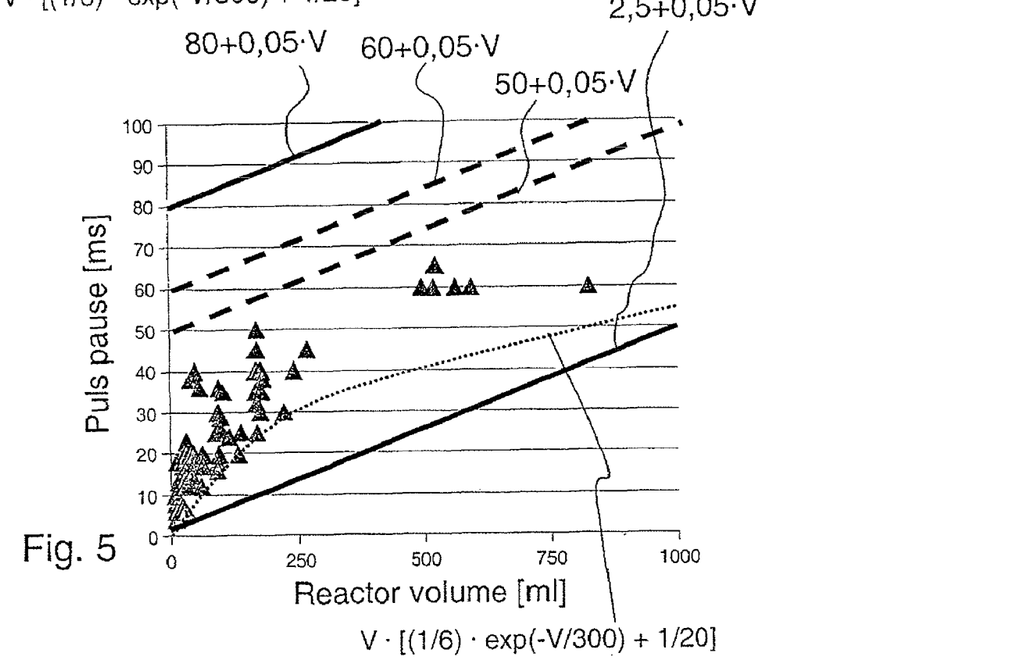

Empirical values of plasma pulse pauses are illustrated in the diagrams of FIGS. 4 and 5 for the deposition of $TiO_2/SiO_2$ interference alternating layers as a function of the reactor volume. Glass ceramic reflectors were coated in the case of the values shown in FIG. 4. FIG. 5 illustrates corresponding values for the coating of reflectors from Suprax glass. The values illustrated emerge respectively as particularly advantageous in order to obtain high index alternating layers of particularly high quality and with sharp interfaces. As is to be seen with the aid of the diagrams, all the values lie above the straight line for which the relationship P[ms]=2.5+0.05*V, preferably P[ms]=2.5+0.055*V specified above holds true. Moreover, the values lie below the straight line given by P[ms]=80+0.05*V. The pulse pause between temporally adjacent plasma pulses can thus be temporally limited to this upper boundary without disadvantageous effects on the formation of the interfaces and the layer purity being produced. According to a refinement of the invention, pulse pauses may generally be used which are shorter than P[ms]=60+0.05*V or even shorter than P[ms]=50+0.05*V. In FIGS. 4 and 5 two straight lines are plotted which correspond to the aforementioned relations. It is obvious from FIGS. 4 and 5 that these limits are generally well suited both for glass substrates (FIG. 5) and glass ceramics substrates (FIG. 5), in the latter case particularly for larger reactor volumina, preferably larger than 100 milliliters.

According to a further refinement of the invention the pulse pause may be chosen that the pause is at least as long as the maximum $$P[ms]=\max(2.5+0.05*V, V\cdot[(\tfrac{1}{6})\cdot\exp(-V/300)+(\tfrac{1}{20})]).$$

To illustrate this embodiment, the function $P[ms]=V\cdot[(\tfrac{1}{6})\cdot\exp(-V/300)+(\tfrac{1}{20})]$ is plotted in FIGS. 4 and 5. In particular, the values plotted in FIG. 5 exhibit that the above given function is a good approximation of the lower limit for optimum coating and a large range of reactor volumina.

Figure 6:
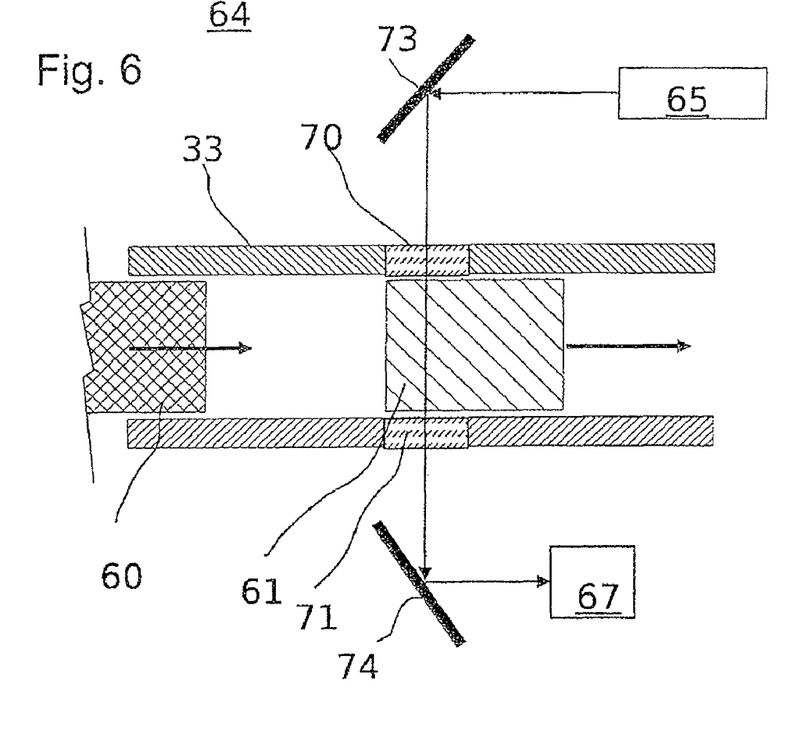
FIG. 6 shows an optical arrangement for acquiring the pulse train shapes, illustrated in FIG. 3, of precursor gases, in particular for measuring their temporal density profiles.

FIG. 6 illustrates an exemplary embodiment of an optical arrangement 64 with the aid of which the density time profile or the time profile of the mass flows of the gas pulses can be acquired. Windows 70, 71 are provided in the discharge line from the gas mixing point, for example in the detour line 33, such that the light beam from a large source 65 can be led transversely through the line 33, and the emerging light beam can be detected by a spectrometer 67. In the example shown in FIG. 6, the light beam is, moreover, deflected by two mirrors 73, 74. The mirrors can themselves be part of the spectrometer. Thus, for example, the mirror 74 can be dichroic and reflect only excited fluorescent light, and pass the light from the light source. The mirror 74 can also be a grating in order to attain spectral splitting. The spectrometer can be used to detect fluorescence lines or absorption lines of the gas mixture of the pulses 60, 61 led through, and can use their intensity to monitor the time profile of the pulses 60, 61. The optical arrangement 64 can also serve for controlling the gas supply, in particular the gas changing device. Specifically, a measure of the gas quantity actually led through can be obtained with the aid of the arrangement. A control could be fashioned such that the valves of the respective precursor gas are switched over when the gas quantity determined with the aid of the measured values is led through. The valves for the further precursor gas are then switched over after the prescribed pulse pause.

One or more emission lines of the plasma can also be detected in a similar way. In this case, the optical arrangement is arranged in the reaction chamber or outside thereof. Since the plasma itself emits light, the light source 65 can be omitted in this case. Again, a recording of the intensity of a specific emission line can be used to control the pulse length of the gas pulses.

Figure 7:
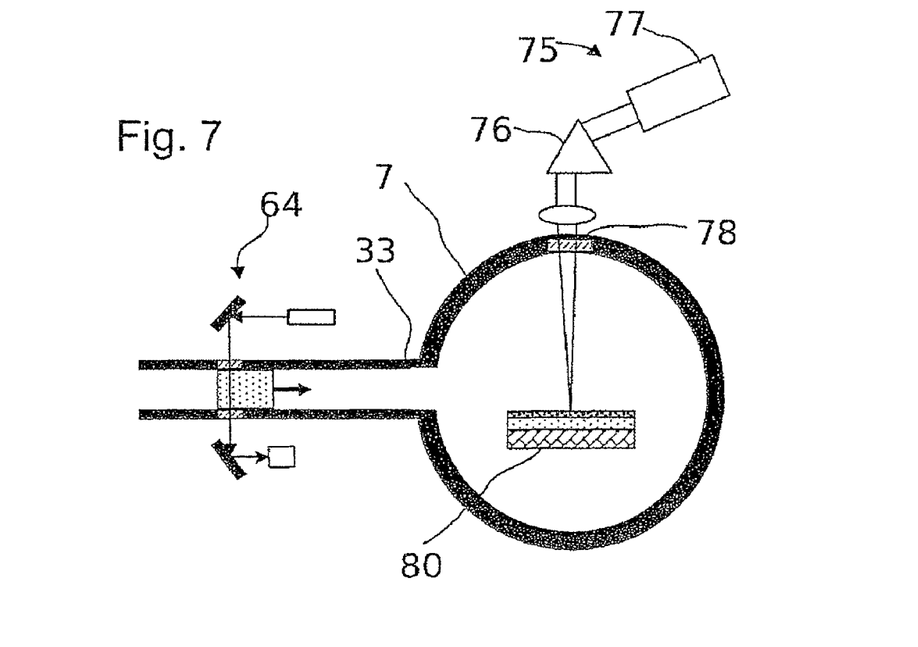
FIG. 7 shows a diagrammatic illustration of a CVD coating system, in particular a PICVD coating system having a device for feeding precursor gases and a spectrometer arrangement for time-resolved acquisition of spectra which are produced during coating inside the reaction chamber.

A CVD reactor having such an exemplary optical arrangement 75 is illustrated diagrammatically in FIG. 7. An optical arrangement in accordance with FIG. 6 is also connected to the supply line to the reaction chamber 7. An article 80 to be coated is arranged in the reaction chamber 7, and the reaction chamber is evacuated. Gas pulses are introduced through the supply line, for example a detour line 33 once more, and a plasma is ignited by means of a device (not illustrated) for irradiating electromagnetic energy in the reactor volume filled with the process gas mixture. A microwave source, for example, can be used as device for irradiating electromagnetic energy. Light which is produced in the plasma passes to the outside through a window 78 in the wall of the reaction chamber 7. The light is split into its spectral components with the aid of a prism 76, and recorded with the aid of a camera 77 or another recording device. The intensity of a specific emission line of the precursor gas can therefore be acquired in a time-resolved fashion in order to obtain an accurate measure of the quantity of deposited material. Just like the optical arrangement 64, this arrangement can also be used to control the pulse length of the gas pulses via the gas changing device.

In the case of the above description of the invention, the term "article" covers both flat and uneven, three-dimensionally shaped substrates or products such as, for example, optical components, reflectors, lenses, ophthalmic lenses or plastics such as are intended for use in spectacles, display lenses, automotive parts such as, for example, instrument covers, luminar covers or panes, lamps or luminars, for example flasher bulbs, halogen bulbs, in particular H3 and H4 bulbs, or high pressure luminars.

The above-described coating can serve to exert spectral influence, and/or to change the reflectivity and/or absorptivity.

Furthermore, barrier layers or defined migration layers can also be produced with the aid of the invention through the particularly precise control of the density, the composition and the thickness of the layer.

Figure 8:
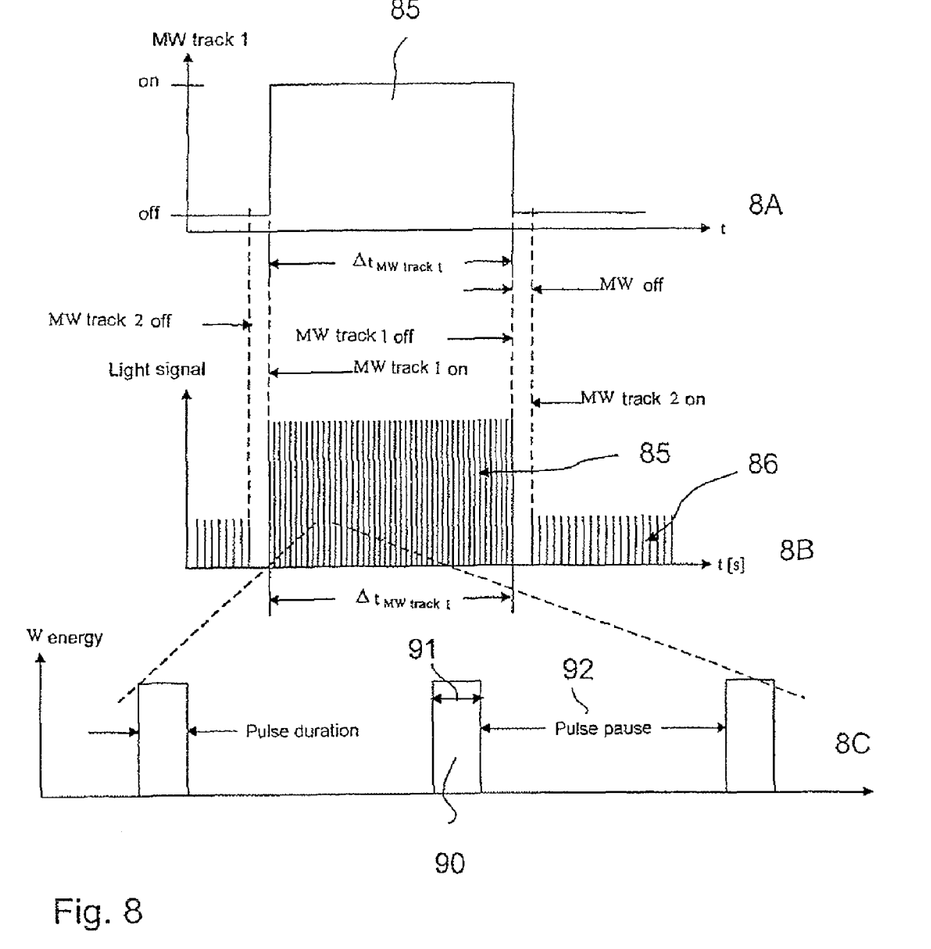
FIGS. 8A to 8C show a diagram of the pulse series used for depositing an alternating layer system.

FIGS. 8A to 8C show a diagram of the pulse series used for depositing an alternating layer system. In addition to a different process gas composition, it is possible to use different parameters such as, in particular, the pulse height, pulse duration, pulse pause and, if appropriate, also pulse shape of the electromagnetic pulses in order to deposit the plies of the alternating layer system, which differ in their composition. The pulse series with these parameters are also denoted below as "tracks". Such a track 85, denoted as track 1, is illustrated in the timing diagram of FIG. 8A. The source, a microwave source here, is operated in pulsed fashion over the time duration $\Delta t_{MW\ track\ 1}$ such that a pulse series of plasma pulses is produced during this period. The light signal of the plasma is illustrated to this end in FIG. 8B as a function of time. FIG. 8C shows a temporally stretched section from the diagram of FIG. 8B. The plasma pulses 90 have a length of duration 91 and are temporally spaced by pauses 92, the pauses 92 being selected in the example shown to be longer than the pulse durations 91.

The plasma pulses of the pulse series express themselves as light flashes, the light flashes of different tracks also being able, as shown with the aid of the example of FIG. 8B, to be of different intensity. The pulse pauses are also different for the tracks 85, 86 in the case of the example shown in FIG. 8B.

It is further to be seen that the microwave pulses between the two tracks 85, 86 are interrupted. The time period "MW off" of this interruption, that is to say the duration between the instants "MW track 2 off" and "MW track 1 on", or "MW track 1 off" and "MW track 2 on", is in this case generally longer than the pulse pause between the individual plasma pulses within the tracks or pulse series.

The coating operation with change of gas has the following temporal sequence:
1. Filling the reactor with the reaction gas, for example HMDSO+$O_2$.
2. Igniting the plasma by switching on the microwave→introducing energy into the gas. As a result, molecules, in particular including the precursor molecules, are split into reactive components. The components are then subjected to a reaction, and condensation of the reaction products takes place at all available free surfaces, in particular, of course, on the workpiece to be coated such as, for example, preferably at the inside of a reflector. Reaction products which are not condensed at free surfaces are pumped off.
3. Pumping off and simultaneously refilling the reactor space. The duration of this operation is temporally dependent on the volume of the reactor space, for example the concave inner region of a reflector, and on the height of the gas flow. The minimum time required for this purpose is the lower straight line plotted in FIGS. 4 and 5, that is to say this time is the time for the single complete gas exchange which is at least required under the given conditions, in particular the volume of the reactor space and the height of the gas flow.

In the example shown in FIG. 8B, the pulse duration 91 (that is to say the MW energy is "on") generally has values between 0.6 and 1.2 ms, and also less or more in exceptional cases. According to the invention, the pulse pause 92 between the individual pauses (that is to say the MW energy is "off", but the gas continues to flow further) is at least so long that a complete gas exchange can take place in the reactor volume, otherwise the reflector is only partially coated during the next MW pulse. This pulse pause is plotted as ordinate in FIGS. 4 and 5.

Since the total input of the effective MW power, and thus also the temperature produced during coating, are regulated via the pulse pause in an advantageous development of the invention, the pulse pause can also be selected to be substantially longer than the minimum time required for a complete gas exchange. Longer pulse pauses 92 have proved to be particularly advantageous in the case of coating processes on glass ceramic substrates.

The synchronization of the plasma pulse series or tracks and of the switching of the valves when changing a gas between the deposition of two plies of an alternating layer is explained below with the aid of FIG. 9. A gas change is understood as a change between two precursor gases such as, for example, a change between $HMDSO+O_2$ and $TiCl_4+O_2$.

Figure 9:
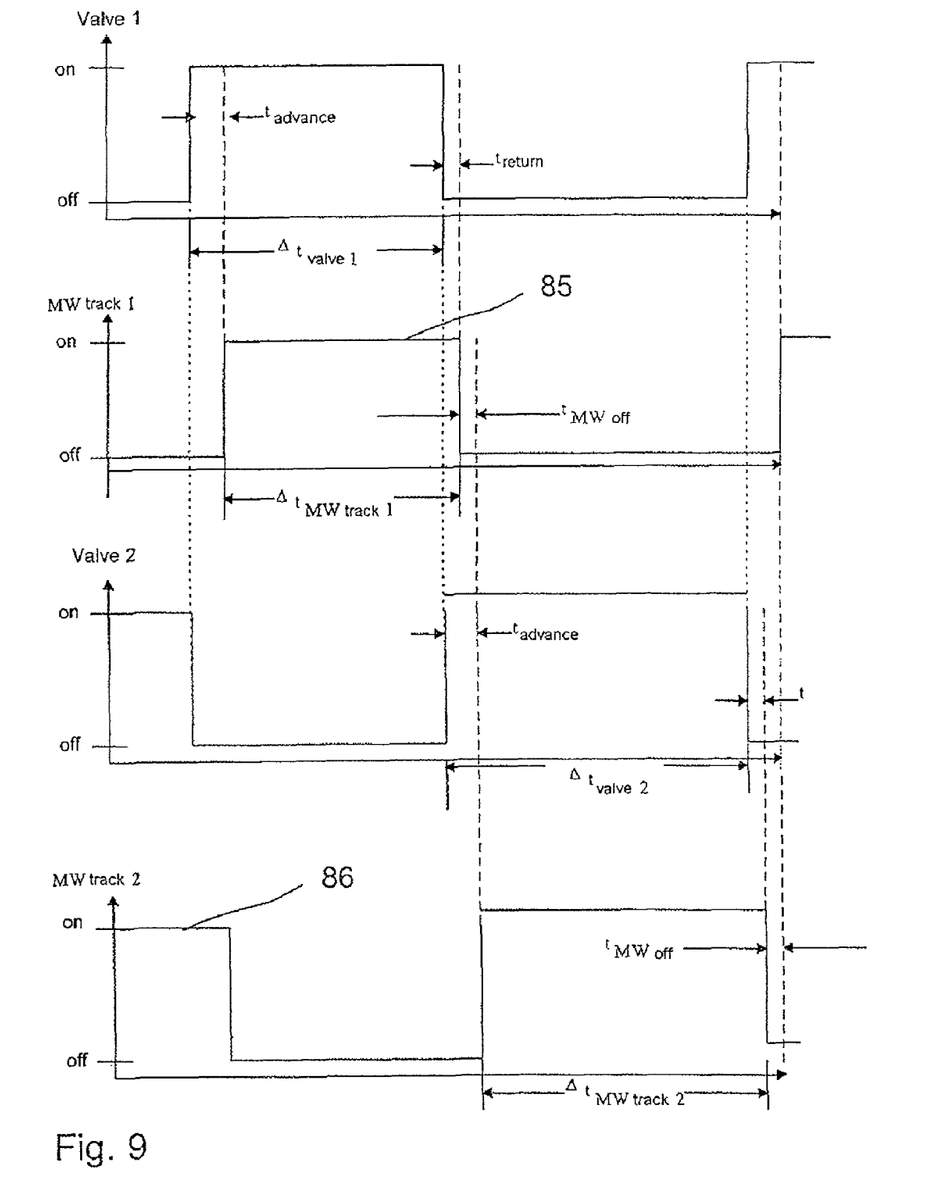
FIG. 9 shows a diagram of the synchronization of plasma pulse series and valves.

The coating system for carrying out the sequence illustrated in FIG. 9 corresponds in this case to the example shown in FIG. 1. FIG. 9 shows four timing diagrams to this end. The uppermost timing diagram ("valve 1") shows the time-dependent switching state of one of the valves 13, 15 of the arrangement shown in FIG. 1, and the diagram "valve 2" shows the switching state of the other one of the two valves. The two other diagrams show the switching states of the two tracks or pulse series 85, 86. The valve 1 is in this case assigned the track 85, and the valve 2 the track 86. This means that a ply is deposited by means of the process parameters of the track 85 with the aid of the process gas introduced through valve 1, and a ply is deposited by means of the process parameters of the track 86 with the aid of the process gas introduced through valve 2.

The time required by the gas from the valve 1 as far as the reaction volume such as, for example, the volume of the concave inner region of a reflector is the advance time $t_{advance}$. The valve is opened and the appropriate microwave track is switched on after the advance time.

The advance time or return time is substantially a function of the geometry of the coating system. Mention is to be made here, in particular, of the length and diameter of the corresponding lines from the gas mixing point to the individual reaction modules such as are to be seen in FIG. 2.

The advance time is equal to the return time in the ideal case. It will be possible in the ideal case for the source such as, for example, a microwave theoretically to be activated over the entire time, that is to say to couple power into the reactor volume continuously during pulsed operation. In this case, there would only be a need at specific instants to switch over the power of the source from the settings for one track to those for the other track.

However, it emerges that this is not generally the case in practice. Consequently, advance time and return time $t_{return}$ are somewhat different in length. Consequently, the source is switched off completely at a time interval "$t_{MW\ off}$" in order not to deposit any undesired mixed layers at the interface between the plies. This time interval is preferably given by the absolute value of the difference between the two times. As a departure herefrom, a duration between $0.8 \times |t_{advance}-t_{return}|$ and at most $5 \times |t_{advance}-t_{return}|$ can be selected for the time interval "$t_{MW\ off}$". Longer durations for "$t_{MW\ off}$" can become sensible, for example, whenever the valves 13, 15 are switched not, as in the example of FIG. 9, simultaneously, but with a short delay.

Since no power is coupled in during the time interval "$t_{MW\ off}$", and therefore no reaction products are produced either, and so also no coating can be deposited, this period should be kept as short as possible for the purpose of maximum coating performance of the system.

It is clear to the person skilled in the art that the invention is not limited to the exemplary embodiments described above, but, rather, can be varied in multivarious ways. In particular, the features of the individual exemplary embodiments can also be combined with one another, and individual features can also be omitted, for example.

The invention claimed is:

1. A method for coating articles with alternating layers in a coating system, an article to be coated being arranged in at least one reaction chamber, or a reaction chamber being formed with an article to be coated, the method comprising:
    evacuating at least the coating region of the reaction chamber,
    leading various process gases sequentially into the coating region, and
    igniting a pulsed plasma for deposition by means of a source of electromagnetic energy which is operated in a pulsed fashion, as a result of which a layer system with plies of different composition, the layer system having interfaces between individual plies, is deposited on the article,
    the introduction of the process gases into the reaction chamber being performed by means of a gas changing device, the gas changing device comprising at least one gas mixing point into which there open at least two supply lines, provided with valves, for various precursor gases, and at least one supply line for a further gas, this further gas being mixed in the gas mixing point with respectively one of the gases introduced through one of the valves and being carried away to the reaction chamber by a discharge line, the supply line for a further gas and the discharge line to the reaction chamber being connected in the connection between the two valves, and in each case a bypass line connected to a pumping device being provided in relation to each of the supply lines for various precursor gases, in each case a further valve being connected into the bypass lines, and the process gas mixture being changed by switching the valves in the bypass lines and the valves of the supply lines for various precursor gases such that the valve in the supply line of a precursor gas is closed while simultaneously the valve in the bypass line for this precursor gas is open, and conversely the valve in the supply line of the other precursor gas is open while the valve in the bypass line for this precursor gas is simultaneously closed, a ply of the alternating layer respectively being deposited by means of a pulse series of plasma pulses, the instant at the beginning of a pulse series for depositing a ply of the alternating layer system being set as a function of the switching time of the valves, and there being set between the pulse series for depositing consecutive plies, of different composition, a pause with a duration of at least $0.8 \times |t_{advance}-t_{return}|$ and at most $5 \times |t_{advance}-t_{return}|$, $t_{advance}$ denoting the time duration required for the gas to reach from the gas mixing point as far as the reaction chamber, and $t_{return}$ denoting the time duration required to empty the process gas mixture previously located in the reaction chamber.

2. The method according to claim 1, characterized in that the source is controlled such that a pulse series for depositing a ply of the alternating layer system is respectively started at an instant which is delayed by a duration T in relation to the switching instant of the assigned valves for the respective process gas mixture for depositing a ply of the alternating layer system in the supply line, the duration T being at least $0.8 \times t_{advance}$ and at most $50 \times t_{advance}$.

3. The method according to claim 1, characterized in that the pressure in the bypass lines is adapted to the pressure in the gas mixing point by means of a regulator.

4. The method according to claim 3, characterized in that the pressure in the bypass lines is adapted to the pressure in the gas mixing point to a pressure difference which is less than 20% of the pressure at the gas mixing point.

5. The method according to claim 1, characterized in that the gases are mixed in a mixing point valve unit in which the valve seats of the two valves are combined in a common valve block.

6. The method according to claim 1, characterized in that oxygen is mixed with at least one precursor in the mixing point.

7. The method according to claim 1 wherein the discharge line to the reaction chamber comprises a detour line which runs with a number of diversions to the reaction chamber and/or comprises obstacles in the discharge line, the gas flow of the gases brought into contact with one another in the gas mixing point being swirled and turbulently mixed in the detour line at the diversions and/or at the obstacles, which lead to eddies in the gas flow such that turbulent mixing of the gases brought into contact with one another in the gas mixing point occurs.

8. The method according to claim 1 wherein various gases of the process gas are mixed in the mixing point, and the gas flow via the discharge line is split into $2^n$, n=2, 3, ... branches into correspondingly many subflows which are respectively led into a reaction chamber, each subflow being split away equally often from the gas flow and being divided into exactly two subflows at each division of the gas flow.

9. The method according to claim 8, characterized in that the subflows are branched off in one of the discharge lines.

10. The method according to claim 1, characterized in that the electromagnetic energy is introduced in the form of pulses such that temporally spaced plasma pulses are produced, and a source is operated in a pulsed fashion being used to produce the electromagnetic energy and is controlled by a control device,
wherein the control device controls the source such that the irradiated pulses of electromagnetic energy produce in the reactor plasma pulses with a duration of length D and a pause of the length P between the pulses, it being valid for the plasma pulses that the pulse pause P in milliseconds is longer between two temporally adjacent pulses than $P_{min}[ms]=2.5+0.05*V$, V denoting the coating volume in the reaction chamber in milliliters, and $P_{min}[ms]$ denoting a time duration in milliseconds.

11. The method according to claim 10, characterized in that the pause P is set longer than $$P[ms]=10+0.133*V,$$

P[ms] denoting a time duration in milliseconds, and V denoting the coating volume in the reaction chamber in milliliters.

12. The method according to claim 10, characterised in that the pause P between pulses adjacent in time is set longer than $$P[ms]=\max(2.5+0.05*V, V \cdot [(\tfrac{1}{6}) \cdot \exp(-V/300)+(\tfrac{1}{20})]),$$

P[ms] denoting a time duration in milliseconds, and V denoting the coating volume in the reaction chamber in milliliters.

13. The method according to claim 10, characterized in that the pause is set shorter than $$P[ms]=80+0.05*V,$$

P[ms] denoting a time duration in milliseconds, and V denoting the coating volume in the reaction chamber in milliliters.

14. A method for coating articles with alternating layers in a coating system, an article to be coated being arranged in at least one reaction chamber, or a reaction chamber being formed with an article to be coated, the method comprising:
evacuating at least the coating region of the reaction chamber,
leading various process gases sequentially into the coating region, and
igniting a pulsed plasma for deposition by means of a source of electromagnetic energy which is operated in a pulsed fashion, as a result of which a layer system with plies of different composition, the layer system having interfaces between individual plies, is deposited on the article,
the introduction of the process gases into the reaction chamber being performed by means of a gas changing device, the gas changing device comprising at least one gas mixing point into which there open at least two supply lines, provided with valves, for various precursor gases, and at least one supply line for a further gas, this further gas being mixed in the gas mixing point with respectively one of the gases introduced through one of the valves and being carried away to the reaction chamber by a discharge line, the supply line for a further gas and the discharge line to the reaction chamber being connected in the connection between the two valves, and in each case a bypass line connected to a pumping device being provided in relation to each of the supply lines for various precursor gases, in each case a further valve being connected into the bypass lines, and the process gas mixture being changed by switching the valves in the bypass lines and the valves of the supply lines for various precursor gases such that the valve in the supply line of a precursor gas is closed while simultaneously the valve in the bypass line for this precursor gas is open, and conversely the valve in the supply line of the other precursor gas is open while the valve in the bypass line for this precursor gas is simultaneously closed, a ply of the alternating layer respectively being deposited by means of a pulse series of plasma pulses, the instant at the beginning of a pulse series for depositing a ply of the alternating layer system being set as a function of the switching time of the valves, and there being set between the pulse series for depositing consecutive plies of different composition a pause with a duration of at least $0.8 \times |t_{advance}-t_{return}|$ and at most $5 \times |t_{advance}-t_{return}|$, $t_{advance}$ denoting the time duration required for the gas to reach from the gas mixing point as far as the reaction chamber, and $t_{return}$ denoting the time duration required to empty the process gas mixture previously located in the reaction chamber, the pause between the pulse series being synchronized with a valve control.

* * * * *